United States Patent
Hsieh et al.

(10) Patent No.: US 10,489,325 B2
(45) Date of Patent: Nov. 26, 2019

(54) USB TYPE-C MODULE

(71) Applicant: eEver Technology, Inc., Taipei (TW)

(72) Inventors: Yu-Chih Hsieh, Hsinchu (TW); Yuan-Bo Chang, Taipei (TW); Sian-Jia Chen, Taoyuan (TW)

(73) Assignee: eEver Technology, Inc., Taipei (TW)

( * ) Notice: Subject to any disclaimer, the term of this patent is extended or adjusted under 35 U.S.C. 154(b) by 0 days.

(21) Appl. No.: 15/698,338

(22) Filed: Sep. 7, 2017

(65) Prior Publication Data

US 2018/0067885 A1 Mar. 8, 2018

Related U.S. Application Data

(60) Provisional application No. 62/384,728, filed on Sep. 8, 2016.

(51) Int. Cl.
| | | |
|---|---|---|
| G06F 13/38 | (2006.01) | |
| G06F 1/22 | (2006.01) | |
| G06F 1/26 | (2006.01) | |
| G06F 1/28 | (2006.01) | |
| G06F 13/40 | (2006.01) | |
| G06F 13/42 | (2006.01) | |
| H01R 13/6598 | (2011.01) | |
| H02J 7/00 | (2006.01) | |
| H05K 5/02 | (2006.01) | |
| H01R 24/40 | (2011.01) | |
| H01R 107/00 | (2006.01) | |

(52) U.S. Cl.
CPC .............. *G06F 13/385* (2013.01); *G06F 1/22* (2013.01); *G06F 1/266* (2013.01); *G06F 1/28* (2013.01); *G06F 13/4068* (2013.01); *G06F 13/4282* (2013.01); *G06F 2213/0042* (2013.01); *H01R 13/6598* (2013.01); *H01R 24/40* (2013.01); *H01R 2107/00* (2013.01); *H02J 2007/0062* (2013.01); *H02J 2007/0095* (2013.01); *H05K 5/0278* (2013.01)

(58) Field of Classification Search
CPC ... G06F 1/22; G06F 1/28; G06F 1/266; G06F 13/4068; G06F 13/4282; G06F 13/385
See application file for complete search history.

(56) References Cited

U.S. PATENT DOCUMENTS

| | | | |
|---|---|---|---|
| 9,400,546 B1 * | 7/2016 | Agarwal | G06F 1/266 |
| 2005/0086434 A1 * | 4/2005 | Kang | G06K 19/07309 711/115 |
| 2015/0331826 A1 * | 11/2015 | Ghosh | G06F 13/4022 710/313 |
| 2016/0352232 A1 * | 12/2016 | Chang | G06F 1/266 |
| 2017/0141593 A1 * | 5/2017 | Chen | H02J 7/0036 |
| 2017/0220090 A1 * | 8/2017 | Kim | G06F 1/266 |

* cited by examiner

*Primary Examiner* — Nimesh G Patel
(74) *Attorney, Agent, or Firm* — Hanley, Flight and Zimmerman, LLC

(57) ABSTRACT

A USB Type-C module has a plurality of ground pins including a first ground pin, a first configuration pin, a second configuration pin and a detector. The detector is electrically connected to the first ground pin and configured to detect a voltage value at the first ground pin so as to selectively enable a controller to determine a configuration of a corresponding connector via at least one of the first configuration pin and the second configuration pin.

15 Claims, 5 Drawing Sheets

USB TYPE-C MODULE

CROSS-REFERENCE TO RELATED APPLICATIONS

This non-provisional application claims priority under 35 U.S.C. § 119(e) to Provisional Patent Application No. 62/384,728 filed in the United States on Sep. 8, 2016, the entire contents of which are hereby incorporated by reference.

BACKGROUND

Technical Field

The disclosure is related to a USB Type-C module, and particularly to the control circuit of the USB Type-C module.

Related Art

Universal serial bus type-C (USB Type-C) connector is a kind of connector proposed by USB-IF. The USB Type-C connector has an advantage that both sides of the connector are the same. That is, the USB Type-C connector has the same advantage as the lightning connector which is used by the products of Apple that the user needs not check the direction of the connector before inserting the connector.

The operating mechanism of the USB Type-C connector is based on that the USB Type-C connector has a controller and two configuration pins (e.g. configuration channel (CC) pins). When the USB Type-C connector is connected to an external connector, the USB Type-C connector communicates with the external connector to check the direction of plugging direction of the external connector via the two configuration pins. However, the controller in the conventional USB Type-C connector operates from time to time, so the aforementioned operating mechanism consumes too much unnecessary power and reduces the durability of a mobile device with battery. Hence, it's a problem to be solved to provide a better operating mechanism of the controller/connector.

SUMMARY

As above, the disclosure is to provide a USB Type-C module which may be capable of automatically detecting whether or not a corresponding connector is connected so as to selectively enable a controller and to reduce the power consumption.

In one embodiment of the present disclosure, a USB Type-C module has a plurality of ground pins including a first ground pin, a first configuration pin, a second configuration pin, and a detector electrically connected to the first ground pin. The detector is configured to detect a voltage value at the first ground pin so as to selectively enable a controller based on the voltage value.

In another embodiment of the present disclosure, a USB Type-C module has a plurality of ground pins including a first ground pin, a first configuration pin, a second configuration pin, a USB Type-C controller electrically connected to the first configuration pin and the second configuration pin, and a detector electrically connected to the first ground pin and the USB Type-C controller. The detector is configured to detect a voltage value at the first ground pin so as to selectively enable the USB Type-C controller based on the voltage value. When the USB Type-C controller is enabled and the USB Type-C module is connected to a corresponding connector, the USB Type-C controller determines a configuration of the corresponding connector via at least one of the first configuration pin and the second configuration pin.

As above, when the USB Type-C module is connected to the corresponding connector, the ground pins are all connected together to ground, so the detector may be capable of determining that the corresponding connector is connected and enabling a controller. Otherwise, the controller is not enabled. Hence, the controller may be not always operating and the unnecessary power consumption may be reduced.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
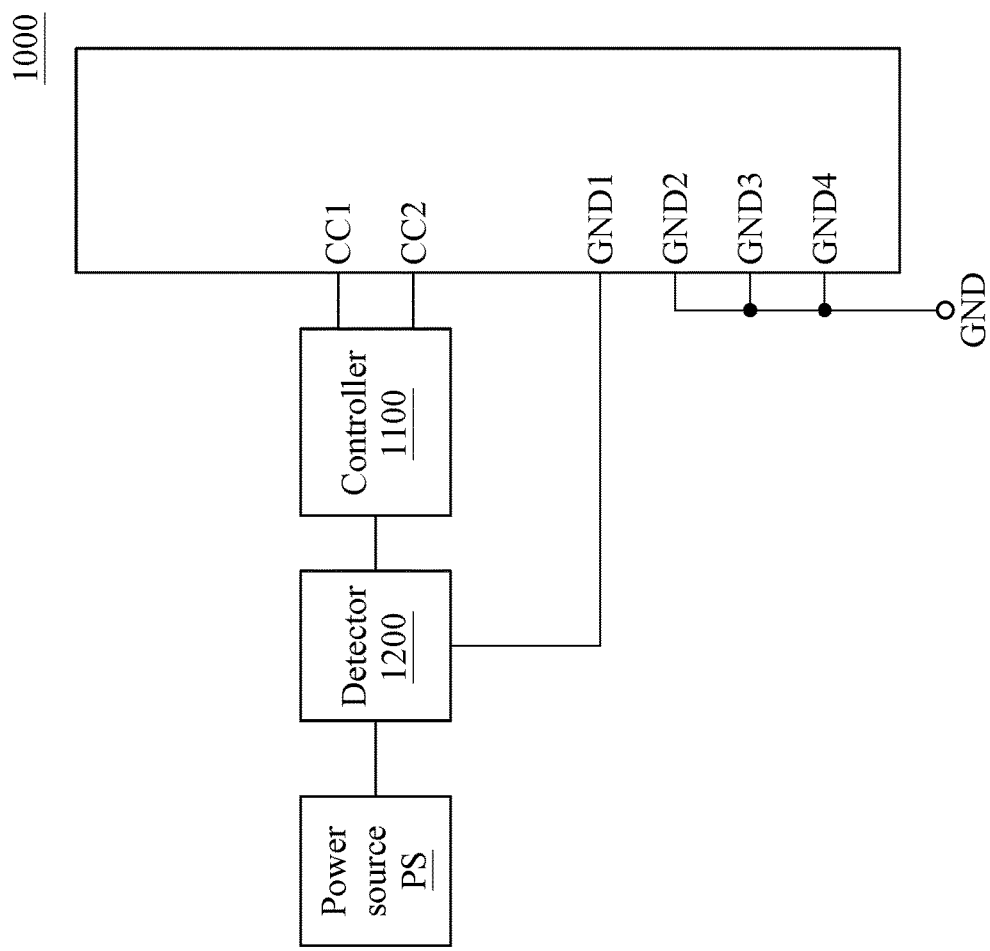
FIG. 1 is a schematic diagram of a USB Type-C module in one embodiment of the present disclosure.

Please refer to FIG. 1, which is a schematic diagram of a USB Type-C module in one embodiment of the present disclosure. As shown in FIG. 1, the USB Type-C module 1000 has a plurality of ground pins GND1~GND4, a first configuration pin CC1, a second configuration pin CC2 and a detector 1200. The ground pin GND2, the ground pin GND3 and the ground pin GND4 are directly connected to a grounding terminal GND while the ground pin GND1 is not directly connected to the grounding terminal GND.

The detector 1200 is electrically connected to one of the ground pins GND1~GND4, which is used for detecting voltage at the connected ground pin, and determines whether or not the USB Type-C module 1000 is connected to a corresponding connector based on the detected voltage value. In this embodiment, the detector 1200 is electrically connected to the ground pin GND1, so as to detect the voltage value at the ground pin GND1. The detector 1200 also determines whether or not the USB Type-C module 1000 is connected to another connector external to the USB Type-C module 1000 (i.e. the corresponding connector) based on the voltage value. For explaining the operation of the detector 1200, please refer to FIG. 2, which illustrates a schematic in which the USB Type-C module 1000 in FIG. 1 is connected to a corresponding connector. In this embodiment, the detector 1200 has a resistive element R, a comparing circuit 1210 and a first power switch 1220. One terminal of the resistive element R is electrically connected to the power source PS, and the other terminal of the resistive element R is electrically connected to the ground pin GND1 which the detector 1200 is electrically connected to. The comparing circuit 1210 is electrically connected to the ground pin GND1 so as to generate a switching signal $V_S$ based on the voltage value at the ground pin GND1 and a threshold voltage VREF. The first power switch 1220 is electrically connected to the power source PS, the controller 1100 and the comparing circuit 1210, respectively. The first power switch 1220 selectively conducts a current path from the power source PS to the controller 1100 based on the switching signal $V_S$ so as to selectively enable the controller 1100.

The controller 1100 which is controlled by the detector 1200 is electrically connected to the first configuration pin CC1 and the second configuration pin CC2. When the controller 1100 is enabled and the USB Type-C module 1000 is connected to the corresponding connector 2000, the controller 1100 is configured to determine the configuration of the connector 2000 via at least one of the first configuration pin CC1 and the second configuration pin CC2. It is noted that the aforementioned corresponding connector 2000 and the USB Type-C module 1000 can be physically corresponding to each other. For example, one among the connector 2000 and the USB Type-C module 1000 is a plug while the other one is a receptacle. Besides, the configuration of the connector 2000 can be referred to the spec/protocol supported by the connector 2000 or the definition of each pin of the connector 2000.

Figure 2:
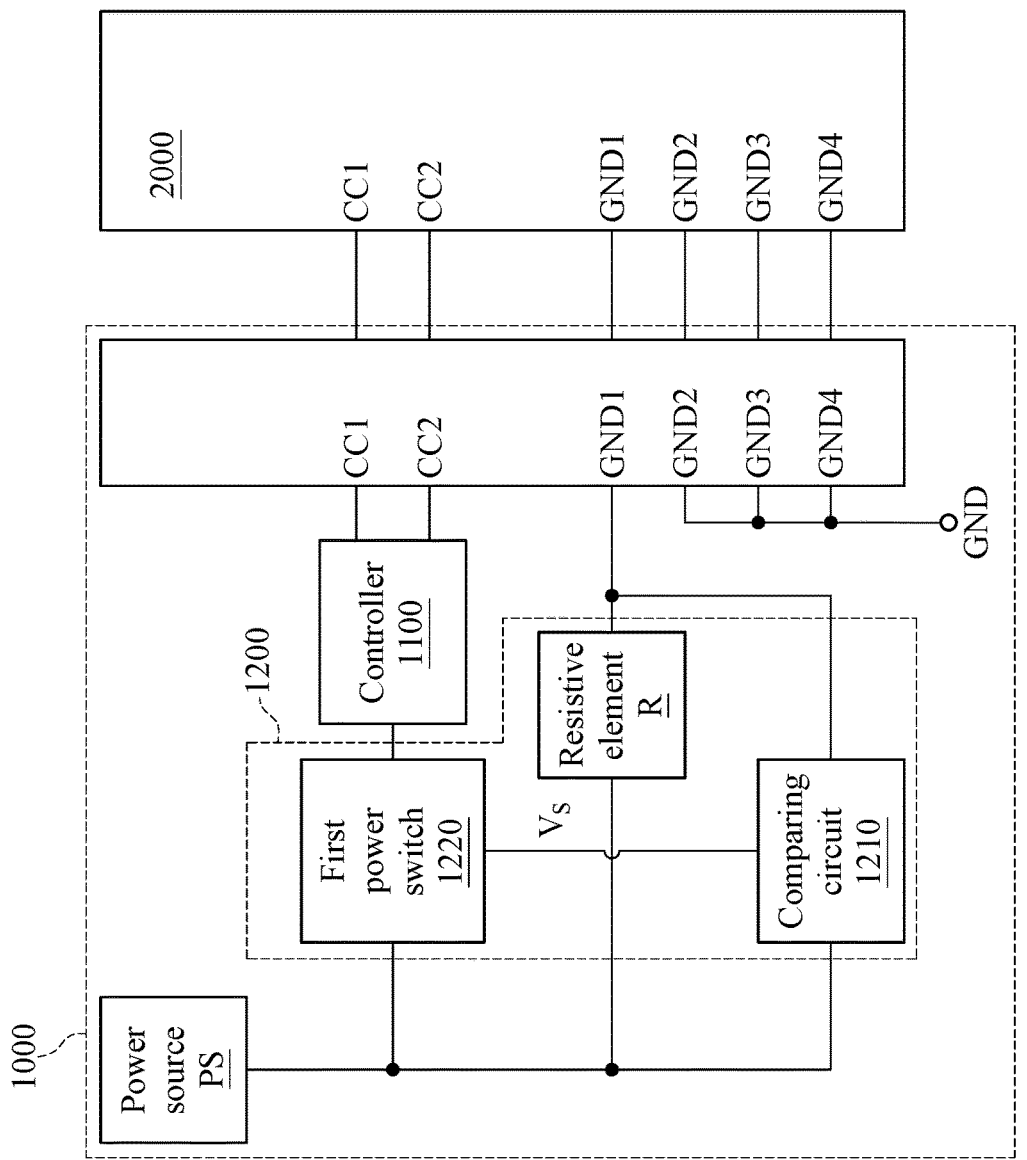
FIG. 2 illustrates a schematic in which the USB Type-C module 1000 in FIG. 1 is connected to a corresponding connector.

As shown in FIG. 2, when the USB Type-C module 1000 is connected to the corresponding connector 2000, the ground pin GND1 is connected to the grounding terminal of the connector 2000 and the ground pins GND2~GND4 are also connected to the grounding terminal of the connector 2000. In other words, the voltage level at the ground pin GND1 is pulled to be equal to the voltage level at the grounding terminal GND. Meanwhile, the voltage value at the ground pin GND1 is less than the threshold voltage VREF, so the comparing circuit 1210 generates a switching signal $V_S$ at a high voltage so as to make the first power switch 1220 conducted. Otherwise, if the USB Type-C module 1000 is not connected to the corresponding connector 2000, the voltage value at the ground pin GND1 is substantially equal to the voltage supplied by the power source PS, which is the high voltage. Hence, the comparing circuit 1210 generates the switching signal $V_S$ at a low voltage so as to make the first power switch 1220 not to be conducted. In other words, with the resistive element R, when the USB Type-C module 1000 is not connected to the corresponding connector 2000, the high voltage value at the ground pin GND1 can be guaranteed. Hence, only when the USB Type-C module 1000 is connected to the corresponding connector 2000, the controller 1100 is enabled and detecting the configuration of the connector 2000 via the first configuration pin CC1 and/or the second configuration pin CC2. In other words, the detector 1200 determines whether or not the USB Type-C module 1000 is connected to the corresponding connector 2000 based on the detected voltage. When the detector 1200 determines that the USB Type-C module 1000 is connected to the connector 2000, the detector 1200 makes one or more circuits or corresponding functional modules to operate. In this embodiment, the corresponding functional module may refer to the controller 1100. Hence, the corresponding functional module or circuit does not operate when the USB Type-C module 1000 is not connected to any device, and thus the unnecessary power consumption is also prevented. In one embodiment, the aforementioned comparing circuit 1210 is, for example, implemented with an analog comparator. In another embodiment, the comparing circuit 1210 is, for example, implemented with a micro controller unit (MCU) or an embedded controller (EC).

Specifically, when the USB Type-C module 1000 is a plug, the detector 1200 detects the configuration of the corresponding connector 2000, such as how many channels the connector 2000 uses for signal transceiving or whether the connector 2000 supports the DisplayPort Alternative mode, via either the first configuration pin CC1 or the second configuration pin CC2. On the other hand, when the USB Type-C module 1000 is a receptacle, the detector 1200 detects the configuration of the connector 2000 via the first configuration pin CC1 and the second configuration pin CC2 at the same time.

In one embodiment, the controller 1100 is in the USB Type-C module 1000. In another embodiment, the controller 1100 is not in the USB Type-C module 1000 but a controller external to the USB Type-C module 1000.

Figure 3:
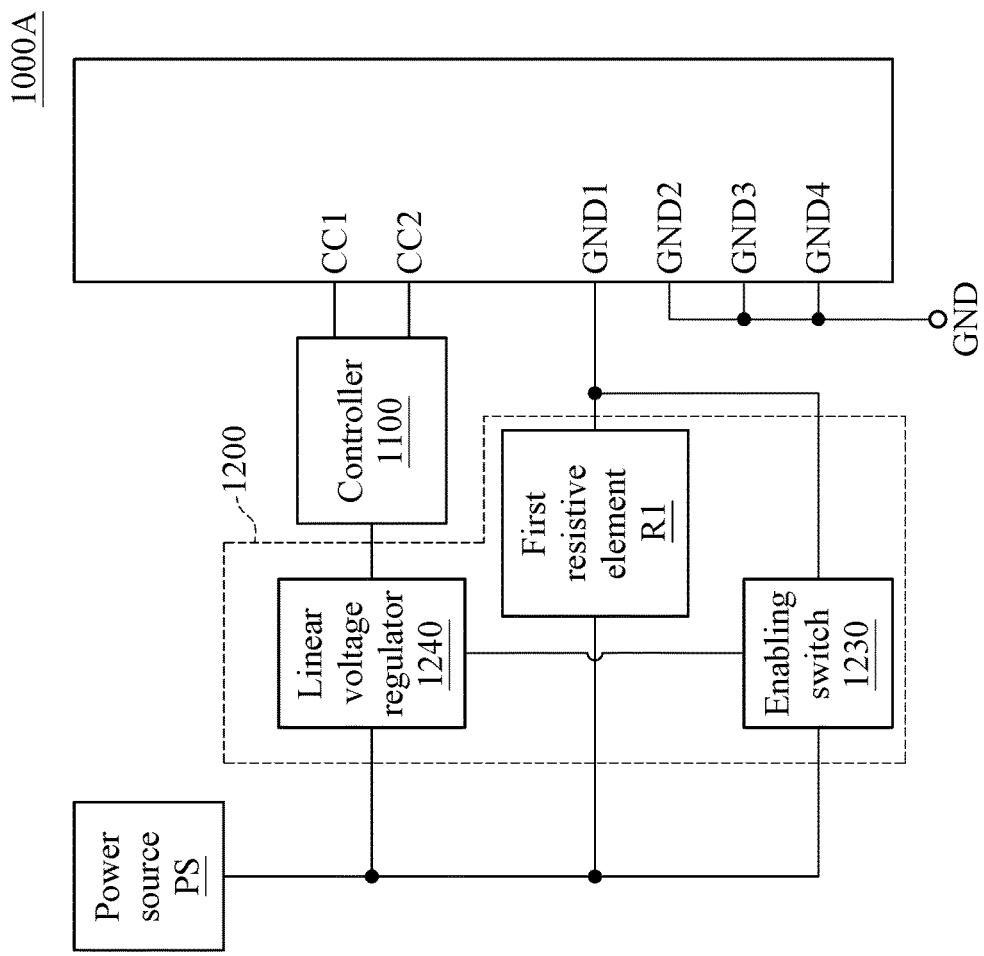
FIG. 3 is a schematic of a USB Type-C module in another embodiment of the present disclosure.

In another embodiment, please refer to FIG. 3, which is a schematic of a USB Type-C module in another embodiment of the present disclosure. As shown in FIG. 3, the USB Type-C module 1000A has a plurality of ground pins GND1~GND4, a first configuration pin CC1, a second configuration pin CC2 and a detector 1200. The ground pins GND2, GND3, and GND4 are all directly connected to the grounding terminal GND while the ground pin GND1 is not directly connected to the grounding terminal GND. The operation of each of the elements in this embodiment is similar to that in the embodiment of FIG. 1. The difference between this embodiment and the embodiment of FIG. 1 is that the detector 1200 in this embodiment has a first resistive element R1, a linear voltage regulator 1240 (e.g. a low drop-out regulator or other type of linear voltage regulator), and an enabling switch 1230. The first resistive element R1 is, for example, a resistor with high resistance. That is, the resistance of the first resistive element R1 is, for example, more than 1 mega-ohm. The first resistive element R1 has one terminal electrically connected to the power source PS and the other terminal electrically connected to the ground pin GND1. When the linear voltage regulator 1240 is enabled, the linear voltage regulator 1240 drains electric power from the power source PS to supply to the controller 1100. The enabling switch 1230 is, for example, an N-type metal-oxide semiconductor field effect transistor (N-MOSFET or NMOS) with its gate terminal electrically connected to the ground pin GND1, its source terminal electrically connected to the grounding terminal GND, and its drain terminal electrically connected to an enable pin of the linear voltage regulator 1240. Hence, when the USB Type-C module 1000A is not plugged into the corresponding connector, the voltage level at the ground pin GND1 is high voltage so that the drain voltage of the NMOS of the enabling switch 1230 is low voltage and the linear voltage regulator 1240 is not enabled. When the USB Type-C module 1000A is plugged into the corresponding connector, the voltage level at the ground pin GND1 is low voltage so that the drain voltage of the NMOS of the enabling switch 1230 is high voltage and the low drop-out is enabled.

Figure 4:
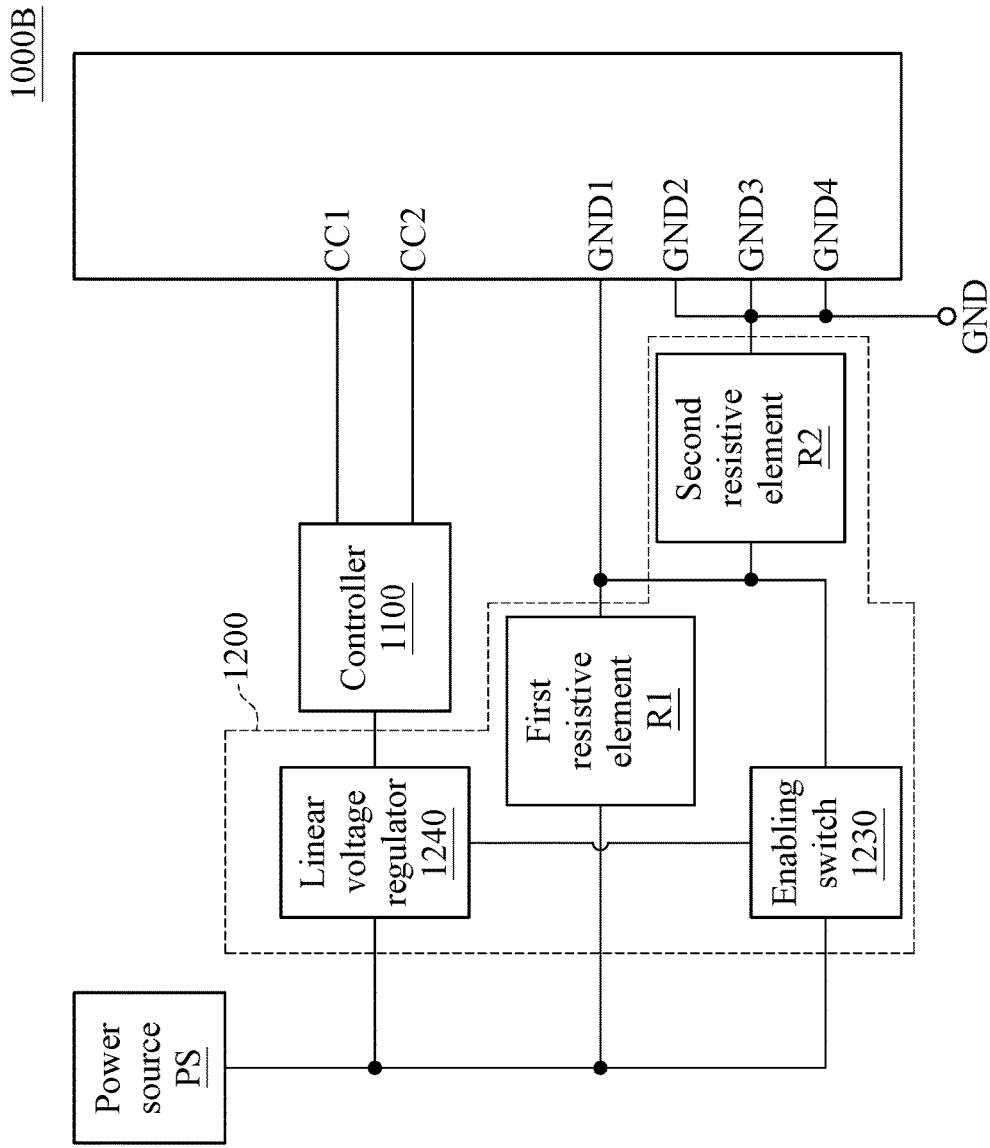
FIG. 4 is a schematic of a USB Type-C module in another embodiment of the present disclosure.

In another embodiment, please refer to FIG. 4, which is a schematic of a USB Type-C module in another embodiment of the present disclosure. As shown in FIG. 4, the USB Type-C module 1000B, compared with the USB Type-C module 1000A in FIG. 3, further has a second resistive element R2. The second resistive element R2 has one terminal electrically connected to the resistive element R1 and the ground pin GND1, and the other terminal electrically connected to the grounding terminal GND. With such feature, it can be prevented that the transistor in the enabling switch 1230 is broken down because of the high gate voltage when the voltage supplied by the power source PS is too high, such as 20 volt or 12 volt.

Figure 5:
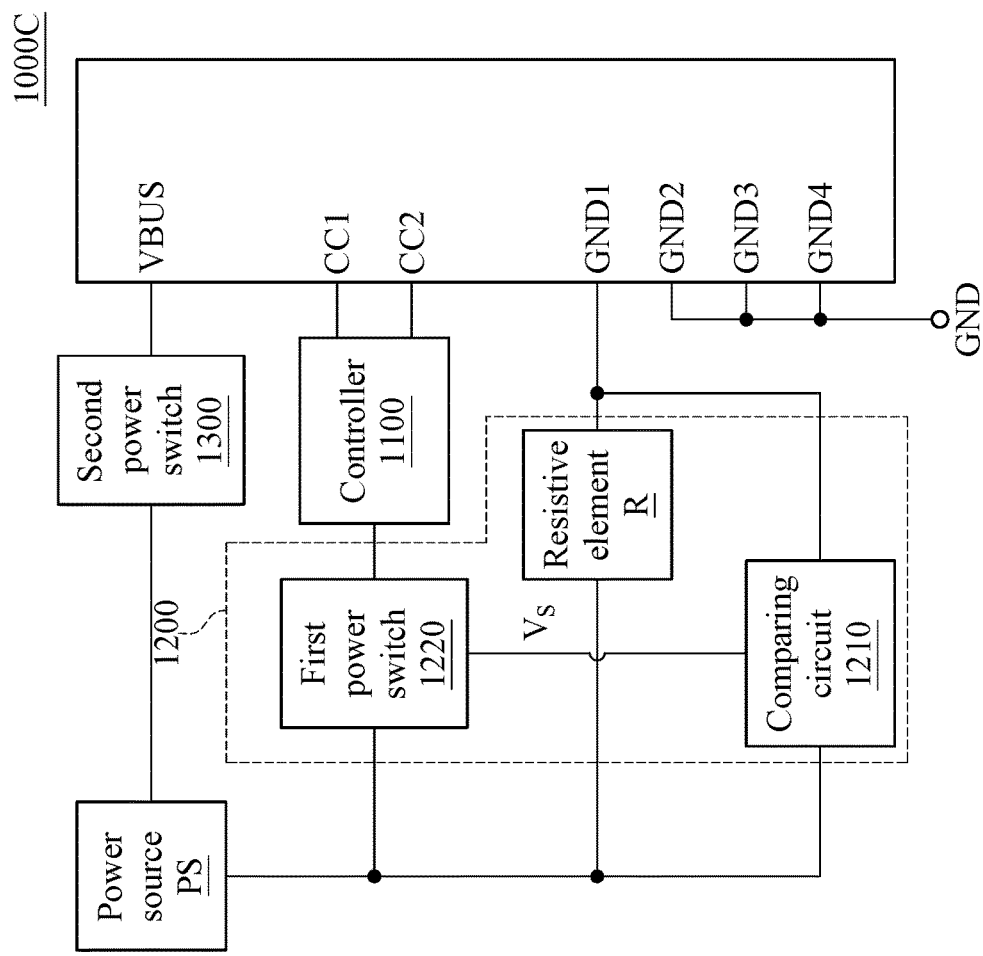
FIG. 5 is a schematic of a USB Type-C module in another embodiment of the present disclosure.

In another embodiment, please refer to FIG. 5, which is a schematic of a USB Type-C module in another embodiment of the present disclosure. As shown in FIG. 5, the USB Type-C module 1000C, compared with the USB Type-C module 1000 in FIG. 2, further has a second power switch 1300. The second power switch 1300 is electrically connected to the power source PS and the power pin VBUS of the USB Type-C module 1000C. The power source PS in the aforementioned embodiment is, for example, a buck converter, a buck-boost converter, or other adequate DC-DC converters.

In one embodiment, if the USB Type-C module 1000C is operated in the host mode, the USB Type-C module 1000C supplies electric power to the connector 2000 when the USB Type-C module 1000C is plugged into the corresponding connector 2000. In this embodiment, the second power switch 1300 is configured to drain electric power from the power source PS and supply the electric power to the connector via the power pin VBUS. In this embodiment, the power source PS converts the direct current (DC) electric power obtained from a battery or converted from mains electricity into electric power with voltage of 12 volt or 20 volt to supply to the second power switch 1300. The power source PS also converts the DC electric power into electric power with voltage of 1.8 volt, 3.3 volt or 5 volt to supply to the detector 1200.

In another embodiment, if the USB Type-C module 1000C is operated in the device mode, the USB Type-C module 1000C can obtain electric power from the connector 2000 when the USB Type-C module 1000C is plugged into the corresponding connector 2000. In this embodiment, the second power switch 1300 is configured to drain electric power from the power pin VBUS to the power source PS. Further, the power source PS converts the electric power obtained from the second power switch 1300 into electric power with voltage of 1.8 volt, 3.3 volt or 5 volt to supply to the detector 1200. The arrangement of the aforementioned second power switch 1300 may be set in the embodiment of FIG. 3 or FIG. 4.

According to USB Type-C module in the aforementioned embodiments, one of the ground pins, such as ground pin GND 1, is isolated from the other ground pins, such as ground pins GND2~GND4, so at to determine whether or not the USB Type-C module is plugged into a corresponding connector based on the voltage at the isolated ground pin. When the pin set of the connector to which the USB Type-C module is plugged is not corresponding to the pin set of the USB Type-C module or the USB Type-C module is not plugged into any connector, the ground pin GND1 of the USB Type-C module is not short to either of the ground pins GND2~GND4. Hence, the detector is capable of determining that the USB Type-C module is not plugged into the corresponding connector, and the built-in/external controller of the USB Type-C module is not enabled. Accordingly, the power consumption is reduced.

What is claimed is:

1. A USB Type-C module, comprising:
    a plurality of ground pins comprising a first ground pin, wherein the first ground pin is isolated from the other ground pins including a second ground pin;
    a first configuration pin;
    a second configuration pin; and
    a detector electrically connected to the first ground pin and configured to detect a voltage value at the first ground pin;
    wherein the detector determines whether or not the USB Type-C module is plugged into a corresponding connector based on the voltage value at the first ground pin, and the detector determines the USB Type-C module is plugged into the corresponding connector and enables a controller when a voltage level of the first ground pin and a voltage level of the second ground pin are pulled to be equal to a voltage level at a grounding terminal of the corresponding connector.

2. The USB Type-C module in claim 1, wherein the controller is electrically connected to the first configuration pin, the second configuration pin and the detector, wherein when the controller is enabled and the USB Type-C module is connected to a corresponding connector, the controller determines a configuration of the corresponding connector via at least one of the first configuration pin and the second configuration pin.

3. The USB Type-C module in claim 1, wherein when the voltage value at the first ground pin is less than a threshold voltage, the detector enables the controller, and when the voltage value at the first ground pin is not less than the threshold voltage, the detector disables the controller.

4. The USB Type-C module in claim 1, wherein the detector comprises:
    a resistive element with a first terminal electrically connected to a power source and a second terminal electrically connected to the first ground pin;
    a comparing circuit electrically connected to the first ground pin and configured to generate a switching signal based on the voltage value and a threshold voltage; and
    a power switch electrically connected to the power source, the controller and the comparing circuit, the power switch configured to selectively conduct a current path from the power source to the controller based on the switching signal.

5. The USB Type-C module in claim 4, wherein when the voltage value is less than the threshold voltage, the comparing circuit sends the switching signal so as to make the power switch conduct the current path.

6. The USB Type-C module in claim 1, wherein the detector comprises:
    a first resistive element with a first terminal electrically connected to a power source and a second terminal electrically connected to the first ground pin;
    a linear voltage regulator electrically connected to a power source and the controller, and configured to drain electric power from the power source to the controller when being enabled; and
    an enabling switch electrically connected to the first ground pin, the linear voltage regulator and the power source, and configured to selectively enable the linear voltage regulator based on the voltage value.

7. The USB Type-C module in claim 6, wherein the detector further comprises:
a second resistive element with a third terminal electrically connected to a ground terminal and a fourth terminal electrically connected to the first ground pin.

8. The USB Type-C module in claim 1, further comprising:
at least one power pin; and
a second power switch electrically connected to the at least one power pin and configured to drain electric power from a power source to the at least one power pin when being enabled;
wherein the detector further selectively enable the second power switch based on the voltage value.

9. A USB Type-C module, comprising:
a plurality of ground pins comprising a first ground pin, wherein the first ground pin is isolated from the other ground pins including a second ground pin;
a first configuration pin;
a second configuration pin;
a USB Type-C controller electrically connected to the first configuration pin and the second configuration pin; and
a detector electrically connected to the first ground pin and the USB Type-C controller, the detector configured to detect a voltage value at the first ground pin, wherein the detector determines whether or not the USB Type-C module is plugged into a corresponding connector based on the voltage value at the first ground pin, and the detector determines the USB Type-C module is plugged into the corresponding connector and enables the USB Type-C controller when a voltage level of the first ground pin and a voltage level of the second ground pin are pulled to be equal to a voltage level at a grounding terminal of the corresponding connector;
wherein when the USB Type-C controller is enabled and the USB Type-C module is connected to a corresponding connector, the USB Type-C controller determines a configuration of the corresponding connector via at least one of the first configuration pin and the second configuration pin.

10. The USB Type-C module in claim 9, wherein when the voltage value is less than a threshold voltage, the detector enables the USB Type-C controller, and when the voltage value is not less than the threshold voltage, the detector disables the USB Type-C controller.

11. The USB Type-C module in claim 9, wherein the detector comprises:
a resistive element with a first terminal electrically connected to a power source and a second terminal electrically connected to the first ground pin;
a comparing circuit electrically connected to the first ground pin and configured to generate a switching signal based on the voltage value and a threshold voltage; and
a power switch electrically connected to the power source, the USB Type-C controller and the comparing circuit, the power switch configured to selectively conduct a current path from the power source to the USB Type-C controller based on the switching signal.

12. The USB Type-C module in claim 11, wherein when the voltage value is less than the threshold voltage, the comparing circuit sends the switching signal so as to make the power switch conduct the current path.

13. The USB Type-C module in claim 9, wherein the detector comprises:
a first resistive element with a first terminal electrically connected to a power source and a second terminal electrically connected to the first ground pin;
a linear voltage regulator electrically connected to a power source and the USB Type-C controller, and configured to drain electric power from the power source to the USB Type-C controller when being enabled; and
an enabling switch electrically connected to the first ground pin, the linear voltage regulator and the power source, and configured to selectively enable the linear voltage regulator based on the voltage value.

14. The USB Type-C module in claim 13, wherein the detector further comprises:
a second resistive element with a third terminal electrically connected to a ground terminal and a fourth terminal electrically connected to the first ground pin.

15. The USB Type-C module in claim 9, further comprising:
at least one power pin; and
a second power switch electrically connected to the at least one power pin and configured to drain electric power from a power source to the at least one power pin when being enabled;
wherein the detector further selectively enable the second power switch based on the voltage value.

* * * * *